United States Patent [19]

Hertler et al.

[11] Patent Number: 5,286,595
[45] Date of Patent: Feb. 15, 1994

[54] PROCESS FOR CREATING A TACKY TONABLE IMAGE SURFACE THROUGH EXPOSURE OF A SUBSTRATE COATED WITH A POLYMER BLEND, INCLUDING A PHOTO-ACID GENERATOR, TO ACTINIC RADIATION

[75] Inventors: Walter R. Hertler, Kennett Square, Pa.; Howard E. Simmons, III, Newark, Del.; Mario Grossa, Dreieich, Fed. Rep. of Germany

[73] Assignee: E. I. du Pont de Nemours and Company, Wilmington, Del.

[21] Appl. No.: 52,424

[22] Filed: Mar. 30, 1993

Related U.S. Application Data

[60] Division of Ser. No. 906,073, Jun. 29, 1992, Pat. No. 5,229,244, which is a continuation-in-part of Ser. No. 564,246, Aug. 8, 1990, abandoned.

[51] Int. Cl.⁵ .............................................. G03F 7/28
[52] U.S. Cl. .................................... 430/144; 430/270; 430/291; 430/292
[58] Field of Search ............... 430/144, 157, 162, 165, 430/166, 176, 191, 192, 193, 270, 271, 275, 291, 292

[56] References Cited

U.S. PATENT DOCUMENTS

| | | | |
|---|---|---|---|
| 3,563,738 | 2/1971 | Itano et al. | 96/28 |
| 4,263,385 | 4/1981 | Pampalone | 430/25 |
| 4,294,909 | 10/1981 | Lee | 430/291 |
| 4,346,162 | 8/1982 | Abele | 430/270 |
| 4,356,252 | 10/1982 | Lee | 430/270 |
| 4,683,190 | 7/1987 | Sondergeld et al. | 430/281 |
| 4,853,364 | 8/1989 | Liang | 503/216 |
| 4,876,172 | 10/1989 | Hillenbrand | 430/253 |

FOREIGN PATENT DOCUMENTS

| | | |
|---|---|---|
| 0303266 | 2/1989 | European Pat. Off. . |
| A20302359 | 2/1989 | European Pat. Off. . |
| A20440444 | 8/1991 | European Pat. Off. . |
| 3806515 | 3/1988 | Fed. Rep. of Germany . |
| 1429082 | 3/1976 | United Kingdom . |
| 2111233 | 3/1985 | United Kingdom . |

Primary Examiner—Charles L. Bowers, Jr.
Assistant Examiner—Christopher G. Young

[57] ABSTRACT

The present invention concerns a phototackifiable composition useful as a coating on a substrate consisting of an optically clear blend of two or more polymers and a photosensitive compound that forms a strong acid on exposure to actinic radiation. The invention also relates to a process for coating such a composition on a support and toning the image-wise exposed composition on the support.

4 Claims, No Drawings

PROCESS FOR CREATING A TACKY TONABLE IMAGE SURFACE THROUGH EXPOSURE OF A SUBSTRATE COATED WITH A POLYMER BLEND, INCLUDING A PHOTO-ACID GENERATOR, TO ACTINIC RADIATION

This is a division of co-pending Ser. No. 07/906,078, filed on Jun. 29, 1992, now U.S. Pat. No. 5,229,244, which is a continuation-in-part of Ser. No. 07/564,246, filed on Aug. 8, 1990, now abandoned.

FIELD OF THE INVENTION

The use of light to cause imagewise formation of tackiness in a film is known as phototackification. The image produced in the light-struck areas can be read out by applying toner particles to the surface. The toner particles selectively adhere to the tacky regions on a surface, thus providing the basis for negative-working color materials for the graphic arts industries. Examples of materials that directly result in tackiness upon irradiation are rare. Most negative working systems require a separate wet development step. The present invention produces a tacky surface by using a process dependent upon the ability of a miscible polymer blend to undergo a photochemical change that results in a microphase separation of a tacky polymer from a non-tacky polymer and does not require a separate wet development step.

The present invention concerns a phototackifiable composition, useful as a coating on a substrate, consisting of an optically clear blend of two or more polymers one or more of which is capable of undergoing an acid catalyzed chemical reaction and a photosensitive compound that forms a strong acid on exposure to actinic radiation. The invention also relates to a process for coating such a composition on a support and toning the image-wise exposed composition on the support. The compositions described herein are useful in the graphic arts area in the production of negative images, including use as coatings for negative working tonable photosensitive elements, in color separations, and in making multicolor images from masters.

BACKGROUND ART

Photosensitive elements are used as reproduction means in a variety of fields involving photographic reproduction. The present invention bases its reproduction capabilities on the differences in adhesive qualities between imagewise exposed and unexposed image areas.

U.S. Pat. No. 4,356,252 teaches a photosensitive element useful for making color proofs comprising a support bearing a layer of negative-working tonable photoimageing composition comprising at least one organic polymeric binder, a photosensitizer which forms an acid upon exposure to actinic radiation, and at least one acetal compound wherein the polymeric binder is plasticized. U.S. Pat. No. 4,294,909 teaches a process for preparing negative tonable images comprising exposing imagewise a photosensitive element bearing a layer of negative-working tonable image composition as in U.S. Pat. No. 4,356,252. The principle involved in U.S. Pat. Nos. 4,356,252 and 4,294,909 is that the photogenerated acid decomposes the (solid) nonpolymeric acetal compound(s) and the resulting liquid products plasticize the binder so that $T_g$ is lowered and the binder becomes tacky enough to be toned. These patents differ from the present invention which achieves its tackiness as the result of a tacky polymer layer present in the composition, which is masked by the presence of a nontacky polymer that is miscible with the tacky polymer. Upon exposure to acid which is generated by exposure of the element to actinic radiation, the tackiness of the tacky polymer is "unmasked".

U.S. Pat. No. 4,263,385 discloses a tonable phototackifiable system based on photodegradation of a poly(acetylene sulfone).

U.S. Pat. No. 4,876,172 discloses phototackifiable particles based on the irradiation of a photoacid generator with resulting depolymerization of acid-labile poly(phthalaldehyde).

U.S. Pat. No. 3,563,738 discloses a reproduction material which combines a first tacky component and a light sensitive component which upon exposure to actinic radiation, changes the heat-activatability and thermal properties of the first component.

U.S. Pat. No. 4,683,290 discloses a process for lowering the viscosity of coating solutions containing a thixotropy-causing filler for the production of light-sensitive reproduction materials.

U.S. Pat. No. 4,346,162 discloses a nonsilver reproduction element for preparing negative tonable images which comprises a support bearing a layer of photosensitive composition comprising at least one thermoplastic binder and at least one thio compound.

GB Patent No. 1,429,082 discloses a method for forming an image by utilizing tackiness of a layer of deteriorative-type natural or synthetic rubber induced by exposure to actinic radiation. The tackiness was induced by image-wise exposing of the layer of the rubber.

GB 2,111,233 B discloses a method of forming a cathode-ray phosphor screen, particularly a method for causing particles to adhere to the sticky surface. A photosensitive composition is exposed to ultraviolet light through a shadow-mask and becomes sticky. Phosphor particles are stuck on a portion of the upward facing sticky surface.

EPA No. 0 303 266 discloses dry nonelectroscopic toners and process for their use comprising pigmented organic resins treated with an organofunctional substituted fluorocarbon compound and their use in toning photosensitive elements having tacky areas.

DE 3806515 C1 discloses a process for the manufacture of metal powders for use as toners of adhesive patterns on ceramic substrates.

SUMMARY OF THE INVENTION

It is an object of the present invention to provide a phototackifiable composition that can result in a tacky polymer upon irradiation.

It is another object of the present invention to provide a phototackifiable composition that can result in a tacky polymer upon irradiation without the need for a separate wet development step.

It is a further object of this invention to provide a process for creating tackiness as a result of changes in the miscability of polymer phases.

In accord with the above objects, this invention provides a coating for use on a substrate comprising an optically clear blend of two or more polymers with a photosensitive compound that forms a strong acid upon image-wise exposure to actinic radiation. The composition of the blend comprises:

(a) at least one first polymer that is tacky as a result of having a glass transition temperature $T_g$ of below room temperature;

(b) at least one second polymer miscible with the first that has a $T_g$ sufficiently far above room temperature so that the blend of first and second polymer(s) is not tacky at room temperature, said second polymer(s) having functional groups that are sensitive to catalytic amounts of a strong acid, such that the reaction of functional groups in the presence of the photogenerated acid result in a polymer with carboxylic acid groups or phenolic groups, said resulting polymer being immiscible with the tacky polymer in the blend; and (c) a composition that generates an acid upon exposure to actinic radiation.

In order for the invention to be operable, the low $T_g$ tacky polymer(s) must be sufficiently soluble in the higher $T_g$, acid labile polymer(s), in some proportion, so that an optically clear, non-tacky coating can be obtained.

In order for the invention to provide tackiness in a short period of time, the relative humidity must be above about 50%. This relative humidity may either be provided by ambient working conditions or by means of a high humidity development chamber.

The need for high humidity may be obviated by subjecting the exposed phototackifiable composition to a thermal development process.

Development may also be brought about under low humidity conditions by employing a solvent vapor chamber.

The requirement for relative humidity greater than about 50%, or a high humidity development chamber or a thermal development step may be avoided by providing a modified composition which composition is another facet of the invention provided by this invention.

Accordingly, this invention also provides a coating for use on a substrate comprising an optically clear blend of two or more polymers with a photosensitive compound that forms a strong acid upon image-wise exposure to actinic radiation. The composition of the blend comprises in addition to a, b, and c as described above, d) a development facilitating additive.

The invention also concerns a substrate coated with either of the above compositions (the above composition) and a process for using said composition on a support and a process for toning the supported composition.

DETAILED DESCRIPTION OF THE INVENTION

This invention consists of a coating (on a substrate, preferably polyester film, e.g., Mylar ®), of an optically clear blend of two or more polymers at least one polymer with a low glass transition temperature ($T_g$), below room temperature, and a second with a high $T_g$ and a photosensitive compound, that yields a strong acid on image-wise exposure to actinic radiation.

It has been found that certain polymers of low $T_g$ are tacky and polymers of high $T_g$ with pendant acid labile groups are non-tacky. By blending the two, a non-tacky optically clear film can be prepared. If a source of photo-generated acid is present in the film (typically approximately 2%), it has been found that the acid will react with the polymer of high $T_g$, causing it not to be miscible with the tacky polymer of low $T_g$. It is thought that surface tackiness occurs because the tacky low $T_g$ material migrates to the surface of the film. The surface is thus provided with a material that can selectively attract toner particles.

Examples of polymers having low $T_g$, i.e., below room temperature are poly(2-phenylethyl acrylate) (PPEA) and poly(3-phenyl-1-propyl acrylate) (PPPA). The low $T_g$ polymer must be sufficiently miscible with the higher $T_g$, acid labile polymer(s), so that an optically clear, non-tacky coating is obtained. The tacky (co)polymers having $T_g$ below room temperature may be prepared by any known polymerization method, for example addition polymerization, condensation polymerization or ring opening polymerization and must be soluble to some extent in the acid labile polymers so that an optically clear coating of the polymer blend can be obtained. The proportion of polymers in the blend are adjusted so that the blend is maintained tack-free and optically clear at ambient temperature. For example, a tertiary blend of 25% poly(tetrahydro-2-pyranyl methacrylate) (PTHPMA), 25% poly(tetrahydro-2-pyranyl acrylate) (PTHPA) and 50% tacky poly(2-phenylethyl acrylate) (PPEA) gives a non-tacky optically clear film at ambient temperature. In the presence of a photogenerated strong acid, PTHPMA and PTHPA form poly(methacrylic acid) and poly(acrylic) acid, respectively, which are not miscable with tacky PPEA. The tacky PPEA forms a separate phase and is able to attract toner particles.

Typically, the $T_g$ of the blend is higher than that of the tacky polymer and lower than that of the acid-labile polymer.

It is preferred that the molecular weight of the tacky polymer(s) be less than 30,000 g/mol.

The acid labile group of the high $T_g$, acid labile, polymer is an acetal ester, t-butyl ester, t-butoxy-carbonyloxy derivative of a phenol, or an acetal ether of a phenol. It is preferred that the molecular weight of the acid-labile (co)polymer(s) be less than about 30,000 g/mol.

The acid generating component of the composition of this invention is a substance that forms an acid upon exposure to actinic radiation. When activated by actinic radiation, the acid generating component furnishes the acid that catalyzes decomposition of the acid labile groups in the polymeric material. Examples of compounds and mixtures which can be used as acid sources include diazonium, phosphonium, sulfonium, and iodonium salts (generally present in the form of salts with complex metal halide ions such as tetrafluoroborate, hexafluoroantimonate, hexafluoroarsenate, and hexafluorophosphate); halogen compounds; o-quinone diazide sulfochlorides; organometal/organohalogen combinations; o-nitrobenzyl esters of strong acids, e.g., toluene sulfonic acid; N-hydroxy amide and imide sulfonates; and, preferably, diphenyl-3-(9-anthryl)-1-propylsulfonium hexafluoroantimonate.

It may be desirable to add a sensitizer to the system to adjust the spectral sensitivity to the available wavelength of the actinic radiation. The need will depend on the requirements of the system and the specific photosensitive acid generator employed. For instance photosensitive acid generators that respond to wavelengths below 300 ran may be sensitized to longer wavelengths by inclusion of polycyclic aromatic hydrocarbon sensitizers such as perylene, pyrene, anthracene and the like.

The time required for development of tackiness following exposure of the above described compositions to actinic radiation will vary depending upon the composition of the coating, the relative humidity, temperature, and whether or not various post-exposure treatments are employed. In order for the invention to provide tackiness in a relatively short period of time, the relative humidity must be above about 50%. If the ambient relative humidity is below about 50%, development of the imagewise tackiness may be effected by subjecting the photoexposed material to a high humidity development chamber. A post-exposure treatment in a simple chamber (as simple as a closed 500 ml beaker with saturated salt solutions or plain water to provide humidification) at humidities of 50–100% for 2–5 minutes gives excellent tack generation and toning density with no loss in resolution.

Alternatively, if the ambient relative humidity is below about 50%, development of the imagewise tackiness may be effected by subjecting the photoexposed material to heat in order to bring about a thermal development process. Here exposure to a heat source, for example, an oven at 50°–100° C. for 30 to 60 seconds suffices to bring about development of the tacky image.

As another alternative, if the ambient relative humidity is below about 50%, development of the imagewise tackiness may be effected by subjecting the photoexposed material to a solvent vapor development chamber. An effective organic vapor such as 2-butanone, methylene chloride, or ethanol can be employed.

The requirement for relative humidity greater than about 50%, or a high humidity development chamber or a post exposure thermal development step may be avoided altogether by providing a modified composition. Another facet of this invention provides a composition, as described above, further comprising a development facilitating additive.

This additive may be of the types commonly referred to as organic solvents, for example, glycols ranging from diethylene glycol to heptaethylene glycol, diacetone alcohol, and dimethylsulfoxide or as plasticizers such as dibutyl phthalate. The development facilitating additive, as usually employed, comprises 2 to 10%, by weight, of the coating composition.

The need for post exposure heating may also be affected by the acid strength of the photogenerated acid or the nature of the acid labile functional group on the acid labile polymer.

The coatings of the photosensitive polymer blends described herein may be prepared by any standard technique including roller coating, drawdown of a solution, extrusion or by spincoating a solution.

The photosensitive composition described above may be applied to various support materials including, but not limited to paper, cardboard, metal sheets, wood, glass, and films or fiber webs of natural or synthetic polymers. The support may be transparent or opaque. The coating may be applied with or without a top protective film to protect the photosensitive coating. It is also possible to include additional nonphotosensitive layers or components, e.g., an antihalation layer, or antihalation ingredient(s). The antihalation layer would be beneath the photosensitive layer, or there could be antihalation compounds included within the coating.

The components of the photosensitive layer are applied to the support either as a solution in volatile solvents or without the use of solvents. Solvents for use on supports include 2-butanone, acetone, methylene chloride, tetrahydrofuran, and ethyl acetate. Applications for which no solvent is required include calendering and extruding. Upon exposure to actinic radiation, the acid liberated by the light converts the acid labile polymers to carboxylic acid or phenolic polymers which are not miscible with the tacky polymer. When microseparation of the phases occurs, it is believed that the tacky phase may migrate to the surface of the film in the exposed areas creating a surface that can be toned.

The concentration of the nonvolatile components of the coating solution can fluctuate within broad limits, but is dependent on the coating method and the thickness desired for the different purposes of application.

To tone the image-wise exposed photosensitive layer, powdered dyes and/or pigments of many different types can be used. For example, inorganic or organic pigments are suitable as are soluble organic dyes. The individual dye particles can be provided with a protective layer of a suitable polymeric material for the purpose of improving handling. Suitable toners are described, for example, in U.S. Pat. Nos. 3,060,024, 3,620,7826 and 3,909,282 which are incorporated herein by reference.

The toning procedure is either implemented manually, e.g., by means of a cotton pad, or a special application device. The image can, in this case, be produced directly on the support, which carries the photosensitive layer. If desired, the toned image can be transferred also to another material by lamination. According to another embodiment, the photosensitive layer is transferred to the final support prior to exposure and there exposed and toned. Depending on the selection of support material, non-transparent as well as transparent images can be produced. For the production of multicolored images several images toned in the individual colors are coated or laminated over each other.

Exposure of the photosensitive layer is accomplished by using radiation furnishing sources. Ultraviolet sources include carbon arcs, mercury vapor arcs, fluorescent lamps with special ultraviolet-emitting phosphors, argon glow lamps, electronic flash units and photographic flood lamps. Direct writing with suitable lasers is also useful. The amount of exposure required for satisfactory reproduction is a function of the nature and concentration of photoacid generator and optional sensitizers in the photosensitive layer, type of radiation source used, and distance between the radiation source and layer surface. In general, exposure times range from about 4 seconds to 2 minutes using standard commercial radiation sources.

EXAMPLES

EXAMPLE 1

Phototackification of Coating of a 50:35:15 Blend of Poly(2-phenylethyl acrylate), Poly(tetrahydropyranyl methacrylate). and Poly(tetrahydropyranyl acrylate)

A solution was prepared by dissolving 1.96 g of poly (2-phenylethyl acrylate) [$M_n=15,200$, $M_w=25,900$, $M_w/M_n=1.64$], 1.4 g of poly(tetrahydro-2-pyranyl methacrylate) [$M_n=6570$, $M_w=8650$, $M_w/M_n=1.32$], 0.6 g of poly(tetrahydro-2-pyranyl acrylate) [$M_n=19,500$, $M_w=33,700$, $M_w/M_n=1.73$], and 0.08 g of diphenyl-3-(9-anthryl)-1-propylsulfonium hexafluoroantimonate ("DPAS") in 17.64 g of 2-butanone. The solution was concentrated to 50% solids and coated on 7 mil Mylar ® polyester film with a 1 mil doctor blade. After drying, the coatings were exposed through a Stouffer neutral density step wedge (Stouffer Graphic Arts Equipment Co., South Bend, Ind. 46617) to 50, 100, 200, and 400 mj/cm$^2$ integrated between 300 and 400 nm) using a Du Pont PC 130 printer containing a 5000 W high pressure mercury lamp. Immediately following the exposure no tackiness was apparent, and no toning occured with black toner. After storing for 2.5 days in the dark, the coatings had become tacky in the areas exposed to light, and application of black toner to the film exposed to 50 mj/cm$^2$ led to full toning of the first 13 steps (corresponding to a density of 0.65). Unexposed areas remained clear and transparent. With the film exposed to 200 mj/cm$^2$ 32 steps were toned (corresponding to a density of 1.56). Differential scanning calorimetry (DSC) of a sample of coating material similarly exposed to 400 mj/cm$^2$ showed a $T_g$ of 1° C., with a second possible $T_g$ at 199° C. There was no endotherm below 200° C., which indicates that there were no remaining tetrahydropyranyl ester groups in the polymer. DSC of a similar coating which contained no DPAS, and which was not exposed to light, showed a $T_g$ of 9.8° C.

EXAMPLE 2

Phototackifiction of Coating of a 2:1:1 Blend of Poly(2-phenylethyl acrylate), Poly(tetrahydropyranyl methacrylate), and Poly(tetrahydropyranyl acrylate)

A 50% solids solution of 0.49 g of poly(2-phenylethyl acrylate) [$M_n = 15,500, M_w = 24,700, M_w/M_n = 1.6, T_g = 2°$ C.), 0.245 g of poly(tetrahydro-2-pyranyl methacrylate)$M_n = 6570, M_w = 8650, M_w/M_n = 1.32$], 0.245 g of poly(tetrahydro-2-pyranyl acrylate) [$M_n = 19,500, M_w = 33,700, M_w/M_n = 1.73$], and 0.02 of DPAS in 2-butanone was coated on 7 mil Mylar ® polyester film with a 1 mil doctor blade, and dried. The coating was exposed through a UGRA Plate Control Wedge 1982 (containing concentric circles spaced-from 4 to 70 μm, a continuous tone wedge, and highlight and shadow half tone dot control patches) to 100 mj/cm$^2$ with the light source of Example 1. Upon removal of the film from the exposure device, haze and tackiness was observed in the light-struck areas. When the image was rubbed with black toner, toner adhered to the light-struck areas providing a negative image. Four steps were toned corresponding to a sensitivity of 25 mj/cm$^2$. Dot-retention was from 2% to 97% dots. Resolution of line and spaces was 6 μM.

EXAMPLE 2A

Phototackifiction of Coating of a 2:1:1 Blend of Poly(2-phenylethyl acrylate). Poly(tetrahydropyranyl methacrylate), and Poly(tetrahydropyranyl acrylate) Containing Diethylene Glycol A solution of 0.170 g of poly(2-phenylethyl acrylate) [$M_n = 13,100, M_w = 20,900, M_w/M_n = 1.59$], 0.090 g of poly(tetrahydro-2-pyranyl methacrylate) [$M_n = 6510, M_w = 10,900, M_w/M_n = 1.69$], 0.090 g of poly(tetrahydro-2-pyranyl acrylate) [$M_n = 14,400, M_w = 35,300, M_w/M_n = 2.45$], 0.025 g of diethylene glycol and 0.010 g of DPAS in 2.0 g of 2-butanone was coated on 2 mil Mylar ® polyester film using a 2 mil doctor blade.

After air drying and conditioning in a N$_2$ dry box overnight, sample strips of the film were exposed through a UGRA Plate Control Wedge 1982 to 215 mJ/cm$^2$ with a light source similiar to that described in Example 1. Under ambient conditions of low humidity (i.e., less than 50% RH) and room temperature, this film showed better imaging characteristics than a control without the diethylene glycol.

EXAMPLE 2B

Thermal-Development of Phototackification Film

A film similar to that in Example 2 was found not to develop adequate tack when used under conditions of low ambient humidity (i.e., less than 50% RH) at room temperature. A post-exposure heat treatment of 30-60 seconds at 50°-100° C. in an oven gave good tack generation and toning density at the expense of some loss in image resolution.

EXAMPLE 2C

Development of Phototackification Film in a Humidity Chamber

A film similar to that in Example 2 was found not to develop adequate tack when used under conditions of low ambient humidity (i.e., less than 50% RH) at room temperature. A post-exposure treatment in a simple chamber (closed 500 ml beaker with sat. salt solutions or plain water) at humidities of 50-100% for 2-5 minutes gave excellent tack generation and toning density with no loss in resolution.

EXAMPLE 2D

Development of Phototackification Film in a Solvent Vapor Chamber

A film similar to that in Example 2 could also be developed in a solvent vapor chamber using solvents such as 2-butanone, methylene chloride or ethanol.

EXAMPLE 3

Phototackification of Coating of a 2:1:1 Blend of Poly(2-phenylethyl acrylate), Poly(tetrahydropyranyl methacrylate), and Poly(tetrahydropyranyl acrylate) with Commercial Photoacid Generator In the composition of Example 2, the DPAS was replaced with 0.06 g of Union Carbide UVI 6974 (a 50% solution of mixed salts of triarylsulfonium hexafluoroantimonate). The coatings were covered with a 1 mil Mylar ® polyester film to prevent photoadhesion to the photomask. The coatings were then exposed through the UGRA wedge of Example 2 to 100 and 200 mj/cm$^2$ with the light source of Example 2. The 1 mil Mylar ® protective sheet was removed after cooling to $-78°$ C. After warming to room temperature (29° C.), the coatings were examined for tackiness and haze. The coating which had been exposed to 100 mj/cm$^2$ showed haze in the lightstruck areas, but was not tacky enough to accept toner. The coating which had been exposed to 200 mj/cm$^2$ showed image-wise haziness, and could be toned. The resulting toned negative image showed no steps. Dot-retention was from 50% to 2% dots. Control coatings with the composition of Example 2 (containing DPAS) similarly exposed through 1 mil Mylar ® cover sheets were toned. The coating exposed to 100 mj/cm$^2$ showed 7 steps (corresponding to a sensitivity of 9 mj/CM2), 10% to 96% dot-retention, and 6μ lines and spaces. The coating exposed to 200 mj/cm$^2$ showed 9 steps (corresponding to a sensitivity of 9 mj/cm$^2$), 20% to 98% dot retention, and 6μ lines and spaces.

EXPERIMENTS A

Preparation of Poly(3-phenyl-1-propyl acrylate)

To a stirred solution of 50.4 g (50 mL, 0.37 mol) of 3-phenyl-1-propanol and 40.9 g (57 mL, 0.404 mol) of triethylamine in 350 mL of dichloromethane cooled in an ice-water bath was added 35.6 g (32 mL, 0.393 mol) of acrylyl chloride at a rate such that the temperature did not exceed 24° C. The mixture was stirred for 15 minutes at room temperature, and a small amount of phenothiazine was added. Then 5 mL of water was added, and the mixture was stirred for 30 minutes. The mixture was washed successively with 3% hydrochloric acid, water, 5% sodium bicarbonate solution, and water. The organic layer was dried over magnesium sulfate, and the solvent was removed under reduced pressure to give 58.64 g of 3-phenyl-1-propyl acrylate.

A solution of 58.64 g (0.308 mol) of 3-phenyl-1-propyl acrylate and 0.2 g of azobis(isobutyronitrile) in 450 mL of degassed ethyl acetate was heated at reflux for 5 hours. Then 0.2 g of azobis(isobutyronitrile) was added, and refluxing was continued for 5 hours. After a final treatment with 0.2 g of azobis(isobutyronitrile) followed by 5 hours of reflux, NMR analysis showed 14% residual monomer. The product was precipitated in methanol and reprecipitated four times from dichloromethane with methanol to give 29 g of poly(3-phenyl-1-propyl acrylate) as a tacky gum. Differential scanning calorimetry showed a $T_g$ of $-11.7°$ C. Gel Permeation Chromatography shows $M_n$ 8420, $M_w$ 13,900, $M_w/M_n = 1.65$.

EXAMPLE 4

Phototackification of Coating of a 2:1:1 Blend of Poly(3-phenylpropyl acrylate, Poly(tetrahydropyranyl acrylate) and Poly(tetrahydropyranyl methacrylate)

In the composition and procedure of Example 2, the 0.49 g of poly(2-phenylethyl acrylate) was replaced with 0.49 g of poly(3-phenyl-1-propyl acrylate). Exposure to 100 mj/cm² resulted in a tacky image which accepted toner well to produce a toned negative image with greater optical density than in Example 2. The 100 mj/cm² exposure resulted in toning of 8 of the neutral density steps corresponding to a sensitivity to 6 mj/cm². This exposure reproduced the 98% holes, and the 4μ lines/spaces.

EXAMPLE 5

Prep of 2-Tetrahydrofuranyl Acrylate Polymer

A. Prep. of 2-tetrahydrofuranyl acrylate monomer

To a 100 mL 3-neck round bottom flask equipped with a stir bar, condenser, and addition funnel was added 39 mL of dihydrofuran (FW 70.09, d=0.927), and 0.18 g of phenothiazine. Acrylic acid (19 mL, FW 72.06, d=1.05) was added dropwise slowly with stirring. A mild exotherm (55° C.) occurred. After cooling to room temperature, 0.415 g of poly(4-vinylpyridine hydrochloride) was added and the reaction was stirred overnight. The acid catalyst was then filtered off and 0.2 g each of calcium hydride and potassium carbonate was added to the filtrate. After removal of excess dihydrofuran on a rotovap, 10 mg of DPPH (2,2-diphenyl-1-picrylhydrazyl hydrate) was added and the slurry was vacuum distilled at 200 mtorr at 26° C. to give 26.0 g of 2-tetrahydrofuranyl acrylate.

B. Prep. of Poly(2-tetrahydrofuranyl acrylate)

To an oven-dried 250 mL 4-neck round bottom flask equipped with a magnetic stirring bar, reflux condenser, a thermometer and an inlet for dry nitrogen gas, was added 29 g of anhydrous tetrahydrofuran, 24 g of 2-tetrahydrofuranyl acrylate, and 1 mL of bis(dimethylamino)methylsilane. The mixture was stirred at room temperature for 30 min. in order to scavange any protonic impurities. The mixture was then cooled to $-29°$ C. with a cooling bath. The cooling bath was removed, and 1.4 g of 1-methoxy-1-trimethylsiloxy-2-methyl-1-propene and 1.0 mL of tetrabutylammonium biacetate (0.1M in propylene carbonate) were added rapidly. During 25 min the temperature rose to 43° C. After standing for 18 hr at ambient temperature, the reaction was quenched with 2 g methanol. After adding a small amount of methylene chloride to reduce viscosity, the reaction mixture was poured slowly into a stirred blender containing 600 mL of hexane. Liquid was decanted from precipitated polymer, which was then washed with an additional 200 mL of hexane. The polymer was dryed under high vacuum. ¹H NMR analysis indicated significant amounts of starting acrylic ester present so the polymer was redissolved in a minimum quantity of $CH_2Cl_2$ and re-precipitated from hexane, then vacuum dried. GPC: $M_n=7370$. DSC: $T_g=27.3°$ C. with decomposition endotherm 175.7° C. (314.6 J/g)

EXAMPLE 6

Phototackification of Coating of a 50:35:15 Blend of Poly(2-phenylethyl acrylate), Poly(tetrahydropyranyl acrylate), and Poly(tetrahydrofuranyl acrylate)

A solution of 0.090 g of poly(2-phenylethyl acrylate) [$M_n=10,000$, $M_w=23,100$, $M_w/M_n=2.31$], 0.063 g of poly(tetrahydropyranyl acrylate) [$M_n=7550$, $M_w=13,200$, $M_w/M_n=1.761$, 0.027 g of poly (tetrahydrofuranyl acrylate) [$M_n=7370$, $M_p=15,000$], and 0.0060 g of DPAS in 3.3 g of 2-butanone was coated on 2 mil Mylar ® polyester film using a 2 mil doctor blade.

After air drying and conditioning in a N₂ dry box overnight, sample strips of the film were exposed through a UGRA Plate Control Wedge 1982 to 30 mJ/cm² with a light source similiar to that described in Example 1.

Under ambient conditions of low humidity (i.e., less than 50% RH) and room temperature, this film showed much higher photospeed than a control as in Example 2. This film also exhibited instant tack generation compared to a control where several minutes of post-exposure hold time is necessary for tack to develop.

Although preferred embodiments of the invention have been described hereinabove, it is to be understood that there is no intention to limit the invention to the precise constructions herein disclosed, and it is to be further understood that the right is reserved to all changes coming within the scope of the invention as defined by the appended claims.

What is claimed is:

1. A process for creating a tonable surface comprising the steps of

I. forming a blend by blending:

a) at least one first polymer that is tacky as a result of having a glass transition temperature $T_g$ of below room temperature;

b) a composition that generates an acid upon exposure to actinic radiation; and c) at least one second polymer that has a $T_g$ sufficiently far above room temperature so that the blend of first and second polymer(s) is not tacky at room temperature, said second polymer(s) having functional groups that are sensitive to catalytic amounts of a strong acid such that the reaction of functional groups in the presence of the acid result in a polymer(s) with carboxylic acid groups or phenolic groups, said resulting polymer(s) being immiscible with the tacky polymer(s) in the blend;

II. dissolving the blend from step I in a solvent;

III. coating a substrate with the blend dissolved in the solvent of step II;

IV. imagewise irradiating the coated substrate to form acid which results in the formation of a tacky tonable image surface.

2. The process of claim 1 wherein the irradiation step is carried out under conditions of at least 50% humidity.

3. The process of claim 1 wherein, after the irradiating step, the coated substrate is exposed to either a solvent vapor chamber or a thermal development process.

4. The process of claim 1 wherein the tacky tonable surface is toned with toner particles which adhere to the tacky surface.

* * * * *

UNITED STATES PATENT AND TRADEMARK OFFICE
CERTIFICATE OF CORRECTION

PATENT NO. : 5,286,595
DATED : February 15, 1994
INVENTOR(S) : Walter R. Hertler and Howard Ensign Simmons It is certified that error appears in the above-identified patent and that said Letters Patent is hereby corrected as shown below:

Column 4, line 27, change "miscable" to --miscible --.

Signed and Sealed this

Nineteenth Day of July, 1994

Attest:

BRUCE LEHMAN

Attesting Officer

Commissioner of Patents and Trademarks